Figure 1:
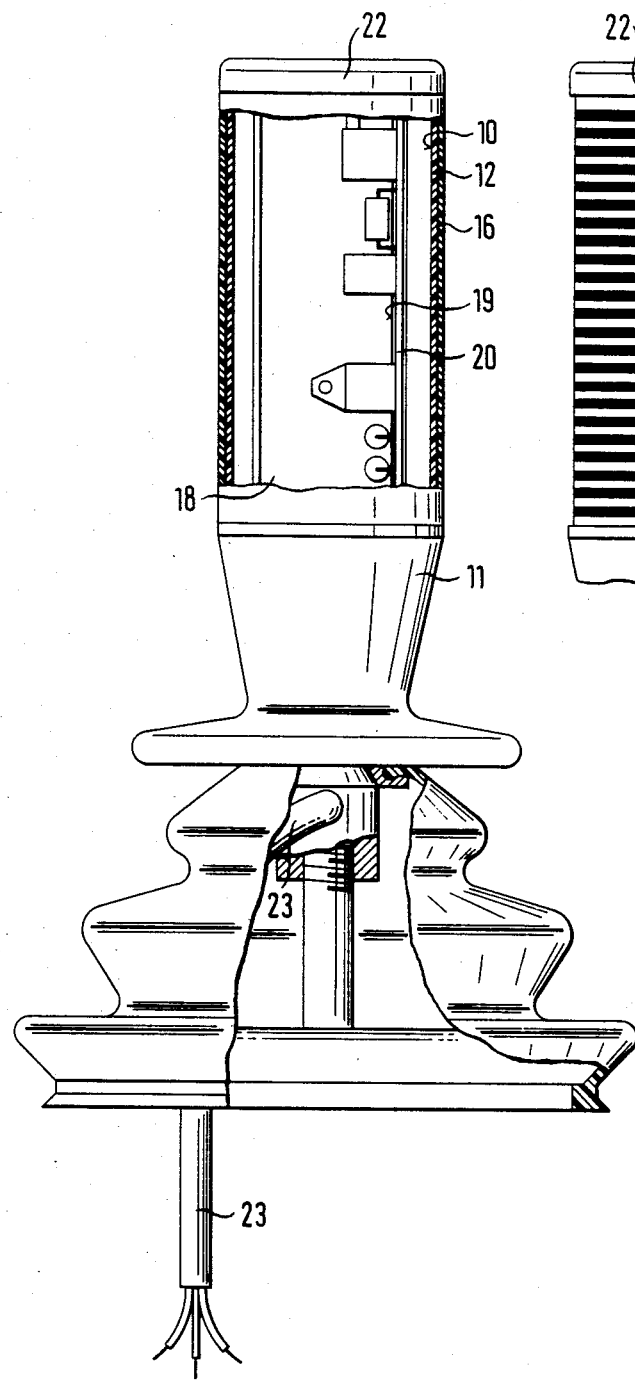

United States Patent [19]

Morsch et al.

[11] Patent Number: 4,656,461
[45] Date of Patent: Apr. 7, 1987

[54] CONTROL HANDLE FOR REMOTELY CONTROLLING A HYDRAULICALLY OPERATED APPARATUS

[75] Inventors: Joachim Morsch, St. Wendel; Walter Heidelberger, Saarbrücken-Dudweiler, both of Fed. Rep. of Germany

[73] Assignee: bso Steuerungstechnik GmbH, Sulzbach, Fed. Rep. of Germany

[21] Appl. No.: 579,130

[22] Filed: Feb. 10, 1984

[30] Foreign Application Priority Data

Dec. 29, 1983 [DE] Fed. Rep. of Germany ... 8337596[U]

[51] Int. Cl.⁴ .............................................. G06F 3/02
[52] U.S. Cl. ........................... 340/365 C; 200/DIG. 1; 74/471 XY; 273/148 B
[58] Field of Search .......... 340/365 A, 365 C, 365 R, 340/365 S, 711, 712; 200/5 R, 5 A, 5 D, 52 R, 157, DIG. 2, DIG. 1; 364/189, 700; 74/471 XY; 244/234, 236; 273/148 B

[56] References Cited

U.S. PATENT DOCUMENTS

| | | | |
|---|---|---|---|
| 4,414,438 | 11/1983 | Maier et al. | 340/709 |
| 4,458,238 | 7/1984 | Learn | 340/365 R |
| 4,495,485 | 1/1985 | Smith | 340/365 C |
| 4,516,939 | 5/1985 | Crimmins, Jr. | 340/365 R |
| 4,517,424 | 5/1985 | Kroczynski | 340/365 R |

Primary Examiner—John W. Caldwell, Sr.
Assistant Examiner—Mahmoud Fatahi-yar
Attorney, Agent, or Firm—Harness, Dickey & Pierce

[57] ABSTRACT

A control handle for remotely controlling a hydraulically operated apparatus. The handle comprises a flexible foil, conductor paths comprised of a pair of independent condensor plates arranged on the foil, and an isolating sleeve surrounding the foil and conductor paths.

4 Claims, 2 Drawing Figures

U.S. Patent  Apr. 7, 1987  4,656,461

CONTROL HANDLE FOR REMOTELY CONTROLLING A HYDRAULICALLY OPERATED APPARATUS

For remotely controlling a hydraulically operated apparatus, e.g. a digger or dredge, it is common to use a control handle, with the actuation thereof resulting e.g. in setting a combustion engine to run at a predetermined speed. This setting may be achieved by pivotal movement of the control handle. It is desirable that the combustion engine is automatically decelerated to idle speed in response to the control handle being released.

To this end the outer surface of the control handle may be provided with a pair of conductor paths isolated with respect to each other by plastic. If the control handle is engaged by a hand, the latter provides a connection between the two conductor paths, and the resistance between the two conductor paths is substantially reduced to the conductivity of the hand. This resistance reduction is sensed by an electronic control circuit to be used for actuating a switch. So the switch is actuated in response to engagement of the control handle such as to accelerate the combustion engine to run at the desired speed. Simultaneously the electronic control circuit provides for a predetermined time delay so that the switching function of automatically resetting the speed to idle speed is performed only about 10 seconds after release of the handle. Such time delay prevents resetting the speed to idle speed in response to a short term release of the handle.

A primary object of the present invention is to provide a control handle having an improved switching reliability in response to engagement and release of the control handle.

A further object is to provide a control handle of a simplified structure.

The present invention results in the switching function of the control handle being, to a large extent, independent of the human skin. This is particularly important in cases when the control handle is actuated in particularly dry areas or by persons wearing gloves or having dry hands.

According to the present invention, the conductor paths are comprised of a pair of condensor plates disposed with respect to each other in comb-like manner and arranged upon a foil which is surrounded by a sleeve of isolating material, so that the switching function is a result of a capacity change due to the control handle being engaged by a human hand which, even when wearing a glove or being extremely dry, causes a sufficient capacity change to have the electronic control circuit control the switch with high reliability.

A plastic sleeve protects the delicate conductor paths on the foil from mechanical damage and contamination.

The structure of the control handle is substantially simplified by making the latter to be hollow so that the signal circuit may be inserted directly into the hollow interior of the handle. This allows supply of the handle including the electronic signal circuit as a unit with the connection between a voltage source and an element to be actuated (e.g. a valve in the fuel line or a relay) being simply provided by a cable.

An embodiment of the invention will be explained in detail with reference to the accompanying drawing. In the drawing, FIG. 1 is a control handle partially in cross-section, and FIG. 2 is a partial view of the control handle including a foil carrying the condensor paths.

A flexible foil 12 is wrapped around the surface 10 of a handle member 11 of isolating material. The foil 12 carries on its outer surface conductor paths 14 and 15 comprised of copper layers.

Figure 2:
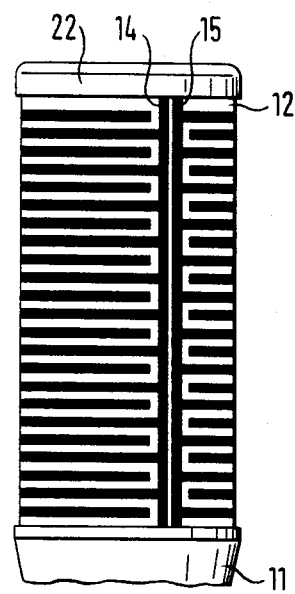

As may be seen from FIG. 2, the conductor paths 14 and 15 each are formed as comb-like members having legs extending parallel to each other and to the longitudinal axis of the handle, with teeth extending from the legs. The teeth of the conductor paths 14 and 15 are spaced from each other and extend transverse to the longitudinal axis of the handle and are arranged in comb-like manner so as not to contact each other.

A thin closed sleeve 16 of plastic is disposed on the foil 12 in surrounding relationship. A hand engaging the control handle for actuation acts as a dielectric to provide a small capacity change between the conductor paths 14 and 15 which is sensed by a suitable electronic control circuit for generating a switch signal.

The control circuit including the aforedescribed time delay function is disposed upon a plate 20 of isolating material, which plate is disposed within the hollow interior of the handle. To this end the inner wall 18 of the handle is provided with opposite grooves 19 into which the plate 20 is inserted. The upper open end of the handle is closed by a closure 22. The connection of the conductor paths 14 and 15 with suitable terminals on plate 20 may be achieved in a conventional manner and is not shown. A cable 23 is connected to plate 20 and extends outwards through a bore within the control handle. The cable 23 is a three-core cable having two cores connected to a voltage source, with the third core carrying the control signal. The control circuit is of sufficient power to directly control by 1 ampere at most a control valve for resetting a combustion engine to idle speed.

In addition this power output is short circuit safe. Furthermore the present invention allows to change the pickup and fall-delay time within wide limits. The responsiveness is adjustable by a potentiometer.

What I claim is:

1. A control handle comprising an insulating base having a cylindrical configuration, conductor paths disposed on the outer surface of said insulating base and adapted to be connected to a voltage source and an electronic control circuit, characterized in that said conductor paths are comprised of a pair of separate condensor plates disposed on a flexible foil wrapper around said insulating base and extending substantially around the circumference of said insulating base and for substantially the full length thereof, said condensor plates being formed as comb-like members having teeth extending parallel and transverse to the longitudinal axis of the handle at the periphery thereof in spaced relationship to each other, and a sleeve of isolating material surrounding said condensor plates.

2. The control handle of claim 1, characterized in that the handle member is hollow and said electronic control circuit is disposed in the hollow interior of the handle member.

3. The control handle of claim 2, characterized in that the components of said control circuit are disposed upon a switch plate inserted in opposite longitudinal grooves at the inner wall of the handle member.

4. The control handle of claim 3, wherein the control circuit provides a holding function for maintaining the circuit in the same state when an operator removes his hand from the handle for a period of time and then changes its state.

* * * * *